United States Patent
Uya

(10) Patent No.: US 7,859,027 B2
(45) Date of Patent: Dec. 28, 2010

(54) BACK IRRADIATING TYPE SOLID STATE IMAGING DEVICE

(75) Inventor: Shinji Uya, Kurokawa-gun (JP)

(73) Assignee: FujiFilm Corporation, Tokyo (JP)

( * ) Notice: Subject to any disclaimer, the term of this patent is extended or adjusted under 35 U.S.C. 154(b) by 476 days.

(21) Appl. No.: 12/047,521

(22) Filed: Mar. 13, 2008

(65) Prior Publication Data

US 2008/0224181 A1     Sep. 18, 2008

(30) Foreign Application Priority Data

Mar. 14, 2007   (JP)  ............................ P2007-065000

(51) Int. Cl.
*H01L 27/148*     (2006.01)
(52) U.S. Cl. .................. 257/228; 257/226; 257/214; 257/229; 257/460; 257/E27.161
(58) Field of Classification Search ................ 257/228, 257/226, 214, 229, 460, E27.161
See application file for complete search history.

(56) References Cited

U.S. PATENT DOCUMENTS 7,498,650 B2 *   3/2009   Lauxtermann .............. 257/460

FOREIGN PATENT DOCUMENTS

JP         2821062 B2    11/1998
JP       2006-32497 A    2/2006

* cited by examiner

*Primary Examiner*—Tu-Tu V Ho
(74) *Attorney, Agent, or Firm*—Birch, Stewart, Kolasch & Birch, LLP

(57) ABSTRACT

A back irradiating type solid state imaging device comprises: a first semiconductor substrate; a plurality of photoelectric converting devices that receives a light incident from a back side of the first semiconductor substrate and are formed in a two-dimensional array on a surface side of the first semiconductor substrate; a CCD type signal reading section that are formed on the surface side of the first semiconductor substrate and reads detection signals of the photoelectric converting devices; and a MOS type signal reading section that are formed on the surface side of the first semiconductor substrate and reads detection signals of the photoelectric converting devices.

6 Claims, 2 Drawing Sheets

(BACK SIDE)    INCIDENT LIGHT

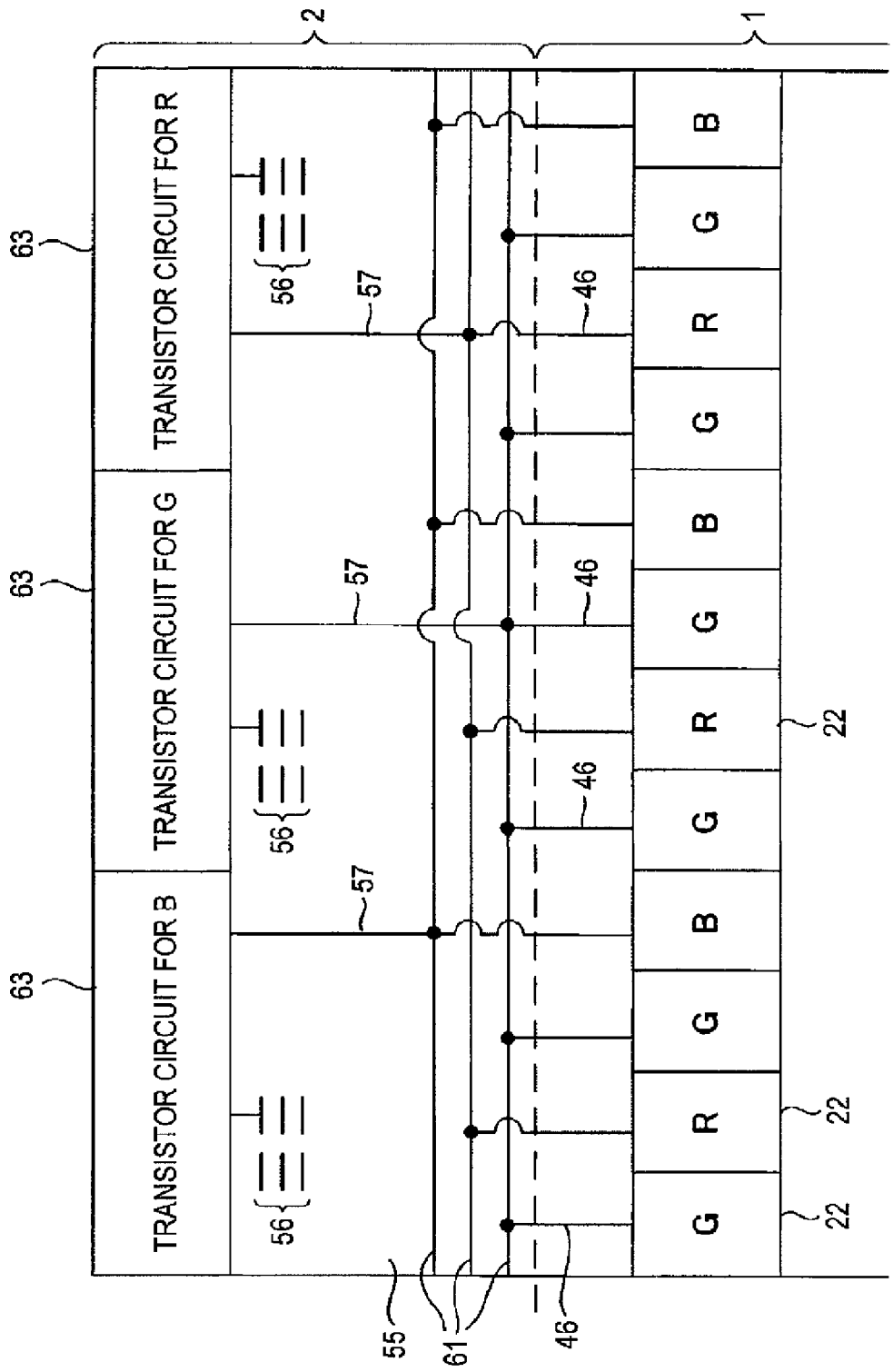

BACK IRRADIATING TYPE SOLID STATE IMAGING DEVICE

BACKGROUND OF THE INVENTION

1. Field of the Invention

The present invention relates to a back irradiating type solid state imaging device having an advantage of a CCD image sensor and that of a CMOS image sensor.

2. Description of the Related Art

There are two types of semiconductor apparatuses which have been widely utilized as an image sensor (an imaging device). One of them is a CCD image sensor and the other is a CMOS image sensor.

For example, a CCD image sensor described in Japanese Patent No. 2821062 has an advantage that an SN ratio is high and an optical characteristic is excellent, and an imaging synchronism of a plurality of pixels provided on a light receiving surface is implemented, and a disadvantage that plural types of source voltages such as a charge reading voltage for reading a signal charge from a pixel to a charge transfer path and a transfer voltage for driving the charge transfer path are required and a consumed power is increased.

On the other hand, for example, a CMOS image sensor described in JP-A-2006-32497 has an advantage that a consumed power is low and an operation is carried out with a single power supply of 3.3 V, and random access and parallel reading can be performed, and a disadvantage that an SN ratio is low and an imaging synchronism is not present.

Thus, the CCD image sensor and the CMOS image sensor have the respective advantages and disadvantages. Therefore, the CCD image sensor is mainly employed for an imaging apparatus for a video and a digital camera requiring a high image quality and a high sensitivity, for example, and the CMOS image sensor is often employed in an imaging module for a portable telephone.

In consideration of the respective advantages and disadvantages, it is selected whether an image sensor to be loaded onto a photographing apparatus is set to have a CCD type or a CMOS type. However, a developer of the photographing apparatus has a great demand for an image having both of the advantages.

For example, there has been highly demanded an image sensor which adds and reads a plurality of pixel signals and executes a high speed photographing operation having a high sensitivity in a low consumed power to implement an increase in speeds of AE and AF in an animation photographing operation and image pickup having a high image quality can be implemented with a high SN ratio in a static image photographing operation.

SUMMARY OF THE INVENTION

It is an object of the invention to provide a back irradiating type solid state imaging device having an advantage of a CCD image sensor and that of a CMOS image sensor.

According to the present invention, there is provided a back irradiating type solid state imaging device comprising: a first semiconductor substrate; a plurality of photoelectric converting devices that receives a light incident from a back side of the first semiconductor substrate and are formed in a two-dimensional array on a surface side of the first semiconductor substrate; a CCD type signal reading section that are formed on the surface side of the first semiconductor substrate and reads detection signals of the photoelectric converting devices; and a MOS type signal reading section that are formed on the surface side of the first semiconductor substrate and reads detection signals of the photoelectric converting devices.

In the back irradiating type solid state imaging device, the MOS type signal reading section may be provided for each of the photoelectric converting devices.

In the back irradiating type solid state imaging device, said plurality of photoelectric converting devices may comprise plural sets of photoelectric converting devices, and the MOS type signal reading section may be provided for each of said plural sets of photoelectric converting devices.

The back irradiating type solid state imaging device may further comprise a second semiconductor substrate including the MOS type signal reading section, and the second semiconductor substrate may be bonded to the surface side of the first semiconductor substrate including the CCD type signal reading section formed thereon.

In the back irradiating type solid state imaging device, the second semiconductor substrate may comprise an insulating layer on a side of the first semiconductor substrate side, and the insulating layer may comprise a wiring layer that adds and reads the detection signals of the photoelectric converting devices.

The back irradiating type solid state imaging device may further comprise at least one kind of color filters on the back side of the first semiconductor substrate, the wiring layer may comprise at least one wiring, and each of said at least one wiring may add the detection signals of ones, on which one kind of color filters having the same color among said at least one kind of color filters are provided, of the photoelectric converting devices.

BRIEF DESCRIPTION OF THE DRAWINGS

FIG. 2 is an explanatory diagram schematically showing a wiring in which a CMOS type signal reading circuit of the back irradiating type solid state imaging device illustrated in FIG. 1 is subjected to a pixel mixture in the device.

DETAILED DESCRIPTION OF THE INVENTION

Figure 1:
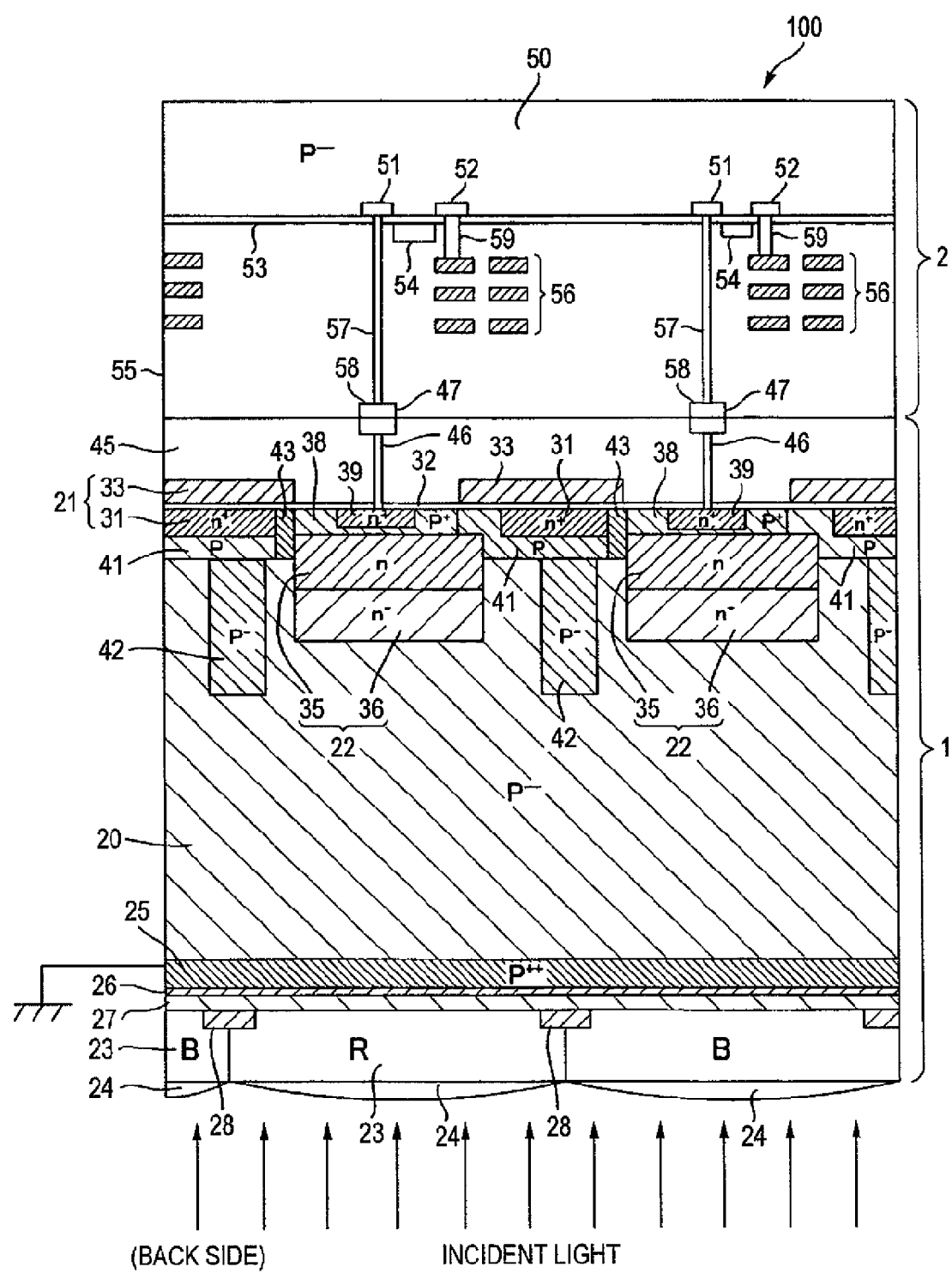
FIG. 1 is a typical view showing a section corresponding to almost two pixels of a back irradiating type solid state imaging device according to an embodiment of the invention.

An embodiment according to the invention will be described below with reference to the drawings.

FIG. 1 is a typical view showing a section corresponding to approximately two pixels of a back irradiating type solid state imaging device according to an embodiment of the invention. A back irradiating type solid state imaging device 100 according to the embodiment is manufactured by bonding a signal reading wafer 2 provided with a transistor circuit and a wiring layer which are used in a CMOS image sensor to a surface side of a semiconductor wafer provided with a plurality of back irradiating type solid state imaging devices 1 of a CCD type by using a technique described in "Wafer Normal Temperature Bonding Apparatus Contributing to High Efficiency and Low Cost Production of MEMS Device" written by Takayuki Gotoh, page 51 of MITSUBISHI HEAVY INDUSTRIES, LTD. News Release VOL. 43 No. 1: 2006, for example, and dicing the respective back irradiating type solid state imaging devices 100 into individual pieces.

The back irradiating type solid state imaging device 1 of the CCD type which is shown is an interline type CCD, and a p-type semiconductor substrate 20 has a vertical charge transfer path (VCCD) 21 and a photodiode (a photoelectric converting device) 22 formed on a surface side and has a color filter (red (R), green (G) blue (B)) layer 23 and a microlens 24 provided on a back side.

A high concentration p layer 25 is formed in a surface portion on the back side of the semiconductor substrate 20 and is grounded. An insulating layer 26 such as silicon oxide or silicon nitride which is transparent to an incident light is provided on the high concentration p layer 25, a layer 27 having a high refractive index which is transparent to the incident light, for example, silicon nitride or a carbon film having a diamond structure is provided as an antireflection film thereon, and the color filter layer 23 and the microlens (top lens) layer 24 are provided thereon in order. Each microlens 24 is formed to be focused on a center of the corresponding photodiode (photoelectric converting device) 22 which is provided in an opposed position.

The color filter layer 23 is partitioned into a pixel (photodiode) unit, and a shielding member 28 for preventing a color mixture between pixels is provided in adjacent sections of the color filter layers 23 on the semiconductor substrate 20 side.

The vertical charge transfer path (VCCD) 21 to be a CCD type signal reading section formed on the surface side of the semiconductor substrate 20 is constituted by a high concentration n layer embedded channel 31 and a transfer electrode film 33 provided through a gate insulating layer 32 formed by a silicon oxide film provided on an uppermost surface at the surface side of the semiconductor substrate 20 and an insulating film having an ONO (oxide film—nitride film—oxide film) structure.

The vertical charge transfer path 21 is formed to be extended in a perpendicular direction to a direction in which a horizontal charge transfer path (HCCD) (not shown) is extended, and a plurality of vertical charge transfer paths 21 is formed. A plurality of photodiodes 22 is formed at a predetermined pitch in the direction of the vertical charge transfer path 21 between the vertical charge transfer paths 21 which are adjacent to each other.

In the embodiment, the photodiode 22 is constituted by an n layer 35 formed on the surface side of the p-type semiconductor substrate 20 and an n-layer 36 formed thereunder. A thin p-type high concentration surface layer 38 for suppressing a dark current is formed in a surface portion of the n layer 35, and an $n^+$ layer 39 is formed as a contact portion in a central surface portion of the surface layer 38.

A p layer 41 having a higher p concentration than the semiconductor substrate 20 is formed under the embedded channel ($n^+$ layer) 31 of the vertical charge transfer path 21, and a $p^+$ region 43 to be a device isolating zone is formed between the n layer 31 and p layer 41 and the photodiode 22 which is right and adjacent thereto in the example shown in the drawing. A $p^-$ region 42 having a higher concentration than the semiconductor substrate 20 is provided under each p layer 41, and a device isolation between the adjacent photodiodes 22 is carried out. The p− region 42 is provided in the pixel partitioning portion, that is, a portion corresponding to the shielding member 28.

The p layer 41 formed under the embedded channel 31 of the vertical charge transfer path 21 is extended to a surface end of the left adjacent n layer 35 in the example shown in the drawing, and the $p^+$ surface layer 38 in the end portion is placed in a retreated position from a position of a right end face of the n layer 35. A left end face of the transfer electrode film 33 is extended to overlap with a left end face of the p layer 41, and the n layer 35 slightly overlaps with surface ends of the transfer electrode film 33 and the p layer 41.

The overlap structure can be employed because the surface side of the semiconductor substrate 20 has a margin on an area basis in the back irradiating type. In a surface irradiating type image sensor in which a light is incident from the object through the surface side of the semiconductor substrate 20, there is no margin on an area basis because an opening is to be ensured, and the end of the transfer electrode film cannot easily be extended to an upper part of the photodiode. However, the extension can easily be carried out in the back irradiating type.

When the p layer 41 is provided between the transfer electrode film 33 and the n layer 35 as in the embodiment, it is possible to drop a reading voltage to be applied to the transfer electrode film (which also serves as a reading electrode) 33. Thus, it is possible to reduce a consumed power of the CCD type solid state imaging device.

The transfer electrode film 33 formed by a polysilicon film is provided on the insulating layer 32 formed on the uppermost surface of the semiconductor substrate 20, for example, and an insulating layer 45 formed of silicon dioxide is provided thereon. Then, an opening is formed in the insulating layers 32 and 45 provided on the $n^+$ layer 39, and the opening is filled with a metallic material such as tungsten so that a longitudinal wiring 46 to be connected to the contact portion 39 is formed and a connecting terminal 47 of the longitudinal wiring 46 is formed of aluminum on a surface of the insulating layer 45.

In the case in which a length of the longitudinal wiring 46 is increased and is thus hard to manufacture from an end to an end at once, it is easy to carry out the manufacture by setting the insulating layer 45 to have a multilayer structure and extending the longitudinal wiring 46 every manufacture of the insulating layer 45.

The signal reading wafer 2 to be bonded, by a bonding technique, to the surface side of the semiconductor wafer (substrate) 20 in which the back irradiating type solid state imaging device 1 having the structure is formed includes a p-type semiconductor substrate 50.

A MOS type signal reading section used in a CMOS image sensor is formed to be pixel compatible in a surface portion on the back irradiating type solid state imaging device 1 side shown in FIG. 1 in the substrate 50. The MOS type signal reading section takes a well-known 3-transistor or 4-transistor structure, and only one transistor constituting them is shown in FIG. 1.

A source 51 and a drain 52 in one MOS transistor constituting the MOS type signal reading section are formed in the surface portion of the substrate 50, a gate insulating film 53 such as silicon dioxide is formed over a whole surface (the imaging device 1 side) thereon, and a gate 54 is formed thereon between the source 51 and the drain 52.

An insulating layer 55 is provided on the gate insulating film 53 and the gate 54, and a three-layer wiring 56 to be used by the CMOS image sensor is embedded in the insulating layer 55. The insulating layer 55 has a multilayer structure and the wiring layer 56 is provided in any of the layers so that the three-layer wiring 56 is formed.

In the related-art CMOS image sensor, a light is incident from a side on which the surface irradiating type, that is, the three-layer wiring layer is provided. Therefore, it is necessary to form the three-layer wiring so as not to block a light receiving surface of each pixel. In the imaging device 100 according to the embodiment, however, a light is incident from a back side and the three-layer wiring 56 does not intercept the incident light. Therefore, an arrangement position and a line width are not restricted and the manufacture can be thus carried out easily.

Moreover, an opening reaching the source 51 is provided on the insulating layer 55 and the gate insulating film 53 and is filled with a metallic material such as tungsten so that a longitudinal wiring 57 is formed, and a connecting terminal 58 of the longitudinal wiring 57 is formed of aluminum on a surface of the insulating layer 55. Furthermore, a longitudinal wiring 59 for connecting the drain 52 to the three-layer wiring 56 is also provided in the insulating layer 55.

The longitudinal wiring 46 to be provided in the solid state imaging device 1 and the longitudinal wiring 57 to be provided in the substrate 50 are formed at an equal pitch. When both of them are bonded to each other, the connecting terminal 47 and the connecting terminal 58 are aligned and bonded to each other.

In the case in which an image of the object is picked up by the back irradiating type solid state imaging device 100 having the structure, a light is incident from a field through the back side of the semiconductor substrate 20. The incident light is collected by the microlens 24 and enters the semiconductor substrate 20 through the color filter layer 23.

When the light collected by the microlens 24 is incident into the semiconductor substrate 20, the incident light is collected to advance in the direction of the photodiode 22 corresponding to the microlens 24 and the color filter 23 and is absorbed into the semiconductor substrate 20, and is photoelectrically converted so that a hole and electron pair is generated.

In the back irradiating type solid state imaging device 100, a distance from the back face of the semiconductor substrate 20 to the n region 22 constituting the photodiode is set to be approximately 9 µm. Therefore, the incident light is absorbed into the semiconductor substrate 20 almost perfectly and is electrically converted before it reaches the $n^+$ region provided on the surface side of the semiconductor substrate 20, that is, the charge transfer path 21. Accordingly, it is not necessary to shield the vertical charge transfer path 21 from the back side.

An electron generated in the photoelectric converting region of each pixel (a region from the p layer 25 to the n region 35) is stored in the n region 35 in the pixel and the hole is discarded to a ground through the p-type layer 25 having a high concentration.

A signal stored in the n region 35, that is, a pickup image signal corresponding to an amount of receipt of a light is read to an outside by two ways. As a first method, the vertical charge transfer path 21 is used in the same manner as in a normal CCD type image sensor. As a second method, the MOS transistor circuit and the three-layer wiring 56 are used in the same manner as in a normal CMOS type image sensor.

In the case in which a static image pickup signal having a high image quality is read, for example, the signal is read to the outside by the method using the vertical charge transfer path 21. More specifically, when a reading voltage is applied to the transfer electrode film 33 which also serves as a reading electrode, a signal charge is read from the n region 35 to the right adjacent embedded channel 31, and is subsequently transferred to a horizontal charge transfer path (not shown) along the vertical charge transfer path 21 and is transferred to an amplifier along the horizontal charge transfer path and the amplifier outputs, as a pickup image signal, a voltage value signal corresponding to an amount of the signal charge in the example shown in the drawing.

In the case in which a dynamic image is picked up and a pickup image signal thereof is read, for example, the signal is read to the outside by using the MOS type signal reading section 51, 52, 54 and 56. More specifically, the signal charge of the relevant pixel (n region) 22 is moved to the transistor 51 side in indicating order from a scanning circuit (not shown) which is formed in a peripheral portion of the back irradiating type solid state imaging device 100 and a signal corresponding to an amount of the charge is output to the outside.

In the case in which an animation is photographed, a plurality of adjacent pixel signals having the same color is added and mixed differently from a static image. Although the pixel mixture may be carried out for individual pixel signals read by the MOS type signal reading section provided corresponding to respective pixels by a signal processing circuit disposed on the outside of the imaging device 100, it is also possible to employ a structure in which the addition and mixture is performed in the insulating layer 55 shown in FIG. 1.

FIG. 2 is a diagram schematically showing a wiring connection mixed in the insulating layer 55. Portions shown in R (red), G (green) and B (blue) in FIG. 2 indicate the n regions (photoelectric converting devices) 22 shown in FIG. 1. The longitudinal wiring 46 is formed from each of the n regions 22 and is connected into the insulating layer 55. In FIG. 2, the connecting terminals 47 and 58 shown in FIG. 1 are omitted.

A wiring layer 61 collecting the pixel wirings 46 having the same color is formed in the insulating layer 55. A set of MOS type signal reading circuits 63 is provided for the pixels having the same color in the surface portion of the wafer 2. Moreover, the three-layer wiring 56 such as a scanning line or a rest line is provided every transistor circuit 63.

Thus, there is employed the structure in which the pixel signals having the same color are mixed and read in the device 100 when the signal is to be read through the signal reading circuit using the MOS transistor of the back irradiating type solid state imaging device 100. Therefore, a signal processing load for the execution of the pixel mixture is relieved, and furthermore, the number of transistor devices which are required and that of the three-layer wirings 56 are decreased. Consequently, it is possible to reduce a manufacturing cost.

As described above, the signal reading section of two types including the CCD type and the CMOS type are loaded onto the back irradiating type solid state imaging device 100 according to the embodiment. Therefore, it is possible to manufacture a small-sized solid state imaging device having advantages of both a CCD image sensor and a CMOS image sensor. It is possible to optionally set which signal reading section is used to read a pickup image signal.

For example, when the camera is turned toward the object to output an image signal of the object from the imaging device 100 in an animation state, the camera carries out an AE (automatic exposure) processing or an AF (automatic focus) processing. By outputting the pickup image signal using the CMOS type signal reading section at this time, it is possible to carry out the AE or AF in a high frame rate of 120 frames per second or more, for example. A high definition static image signal picked up by pressing down a release button is read by the CCD type signal reading section. Consequently, it is possible to obtain a pickup image signal having high S/N.

While the CMOS type signal reading circuit for reading the pickup image signal per pixel is provided for each of the pixels in the embodiment shown in FIG. 1, it is also possible to employ a structure in which one CMOS type signal reading circuit is provided for a plurality of pixels without a mixture of the pixels and the pixels are thinned to read the signal.

Although the description has been given to the embodiment in which the back irradiating type solid state imaging device 1 is set to have the CCD type and the wafer 2 provided with the CMOS type signal reading circuit is bonded thereto, moreover, it is also possible to employ a structure in which the back irradiating type solid state imaging device 1 is set to have the CMOS type and the wafer 2 provided with the CCD type signal reading section is bonded thereto. Furthermore, it is also possible to form the wiring layer 56 in FIG. 1 and the wiring layer 61 in FIG. 2 on the insulating layer 55 side and the insulating layer 45 side.

The back irradiating type solid state imaging device according to the invention comprises both the MOS type signal reading section and the CCD type signal reading section. Therefore, it is possible to have an advantage of an MOS image sensor and that of a CCD image sensor.

The back irradiating type solid state imaging device according to the invention produces an effect to have both the advantage of the CCD type image sensor and that of the CMOS type image sensor, and is useful as a solid state imaging device to be loaded onto a digital camera.

The entire disclosure of each and every foreign patent application from which the benefit of foreign priority has been claimed in the present application is incorporated herein by reference, as if fully set forth.

What is claimed is:

1. A back irradiating type solid state imaging device comprising:
    a first semiconductor substrate;
    a plurality of photoelectric converting devices that receives a light incident from a back side of the first semiconductor substrate and are formed in a two-dimensional array on a surface side of the first semiconductor substrate;
    a CCD type signal reading section that are formed on the surface side of the first semiconductor substrate and reads detection signals of the photoelectric converting devices; and
    a MOS type signal reading section that are formed on the surface side of the first semiconductor substrate and reads detection signals of the photoelectric converting devices.

2. The back irradiating type solid state imaging device according to claim 1,
    wherein the MOS type signal reading section is provided for each of the photoelectric converting devices.

3. The back irradiating type solid state imaging device according to claim 1,
    wherein said plurality of photoelectric converting devices comprise plural sets of photoelectric converting devices,
    and the MOS type signal reading section is provided for each of said plural sets of photoelectric converting devices.

4. The back irradiating type solid state imaging device according to claim 1, further comprising a second semiconductor substrate including the MOS type signal reading section,
    wherein the second semiconductor substrate is bonded to the surface side of the first semiconductor substrate including the CCD type signal reading section formed thereon.

5. The back irradiating type solid state imaging device according to claim 4,
    wherein the second semiconductor substrate comprises an insulating layer on a side of the first semiconductor substrate side, and
    wherein the insulating layer comprises a wiring layer that adds and reads the detection signals of the photoelectric converting devices.

6. The back irradiating type solid state imaging device according to claim 5, further comprising at least one kind of color filters on the back side of the first semiconductor substrate,
    wherein the wiring layer comprises at least one wiring, and each of said at least one wiring adds the detection signals of ones, on which one kind of color filters having the same color among said at least one kind of color filters are provided, of the photoelectric converting devices.

* * * * *